(12) United States Patent
Li et al.

(10) Patent No.: US 12,295,209 B2
(45) Date of Patent: May 6, 2025

(54) DISPLAY PANEL AND DISPLAY DEVICE (71) Applicant: Xiamen Tianma Display Technology Co., Ltd., Xiamen (CN)

(72) Inventors: Jieliang Li, Xiamen (CN); Ping An, Xiamen (CN)

(73) Assignee: XIAMEN TIANMA DISPLAY TECHNOLOGY CO., LTD., Xiamen (CN)

( * ) Notice: Subject to any disclaimer, the term of this patent is extended or adjusted under 35 U.S.C. 154(b) by 491 days.

(21) Appl. No.: 17/857,198

(22) Filed: Jul. 5, 2022

(65) Prior Publication Data

US 2023/0171996 A1 Jun. 1, 2023

(30) Foreign Application Priority Data

Nov. 30, 2021 (CN) .......................... 202111452061.8

(51) Int. Cl.
*H10K 59/12* (2023.01)
*H10K 59/121* (2023.01)
*H10K 59/131* (2023.01)

(52) U.S. Cl.
CPC ..... *H10K 59/1213* (2023.02); *H10K 59/1216* (2023.02); *H10K 59/131* (2023.02)

(58) Field of Classification Search
CPC ............. H10K 59/1213; H10K 59/121; H10K 59/1216
USPC ......................................................... 257/76
See application file for complete search history.

(56) References Cited

U.S. PATENT DOCUMENTS

2021/0225293 A1 7/2021 Wang

FOREIGN PATENT DOCUMENTS

| CN | 111 72 47 44 A | 9/2020 | |
|---|---|---|---|
| CN | 111 75 49 21 A | 10/2020 | |
| CN | 11220 12 08 A | 1/2021 | |
| CN | 112 39 70 29 A | 2/2021 | |
| CN | 112309328 A * | 2/2021 | ........... G09G 3/2007 |
| CN | 113 14 01 79 A | 7/2021 | |

(Continued)

OTHER PUBLICATIONS

Cite the machine translation. Ikeda M (TW-202103122-A).*

(Continued)

*Primary Examiner* — Phuc T Dang
(74) *Attorney, Agent, or Firm* — East IP P.C.

(57) ABSTRACT

The present application discloses a display panel and a display device. The display panel includes: a pixel circuit and a light-emitting element; the pixel circuit includes a driving transistor, a light-emitting control transistor and an initialization transistor; the driving transistor is configured to provide a driving current for the light-emitting element; the light-emitting control transistor is configured to selectively allow the light-emitting element to enter a light-emitting stage; the initialization transistor is configured to provide an initialization signal for the light-emitting element; wherein one of the light-emitting control transistor and the initialization transistor is a PMOS transistor, and the other is an NMOS transistor, a gate of the light-emitting control transistor receives a light-emitting control signal, and a gate electrode of the initialization transistor receives the initialization signal; wherein the light-emitting control signal and the initialization signal are the same signal.

20 Claims, 8 Drawing Sheets

(56) References Cited

FOREIGN PATENT DOCUMENTS

| | | | | |
|---|---|---|---|---|
| CN | 113 65 85 55 A | | 11/2021 | |
| CN | 113690259 A | * | 11/2021 | ......... H01L 27/3262 |
| TW | 202103122 A | * | 1/2021 | ........... G06F 3/0412 |

OTHER PUBLICATIONS

Cite the machine translation. CN-113690259-A).*
Cite the machine translation. CN-112309328-A).*
The First Office Action for CN Application No. 2021 11 452061.8, dated May 27, 2023, 13 pages.

* cited by examiner

DISPLAY PANEL AND DISPLAY DEVICE

CROSS-REFERENCE TO RELATED APPLICATION

The present application is based upon and claims priority to Chinese Patent Application No. 202111452061.8, filed on Nov. 30, 2021, which is incorporated herein by reference in its entirety.

TECHNICAL FIELD

The present application refers to the field of display technology, and in particular to a display panel and a display device.

BACKGROUND

At present, a display panel is composed of a plurality of pixel circuits and a plurality of light-emitting elements arranged in an array, and the pixel circuit is usually composed of thin film transistors (Thin Film Transistors, TFTs) and capacitors.

In an existing pixel circuit, transistors are usually used to realize light-emitting control and initialization control of a light-emitting element. The initialization control is to initialize a voltage across the light-emitting element before a light-emitting stage of the light-emitting element, and the light-emitting control is used to control the light-emitting element to enter the light-emitting stage. In a display panel, a plurality of light-emitting control signal lines and a plurality of initialization signal lines are required to transmit light-emitting control signals and initialization signals respectively, so that increased number of signal lines are provided in the display panel.

SUMMARY

According to embodiments of the present application, there is provided a display panel and a display device, which can solve a technical problem that there is too much signal lines in a display panel.

In a first aspect, according to embodiments of the present application, there is provided a display panel. The display panel includes: a pixel circuit and a light-emitting element; wherein the pixel circuit includes a driving transistor, a light-emitting control transistor and an initialization transistor; the driving transistor is configured to provide a driving current for the light-emitting element; the light-emitting control transistor is configured to selectively allow the light-emitting element to enter a light-emitting stage; and the initialization transistor is configured to provide an initialization signal for the light-emitting element; wherein one of the light-emitting control transistor and the initialization transistor is a PMOS transistor and the other of the light-emitting control transistor and the initialization transistor is an NMOS transistor, and a gate electrode of the light-emitting control transistor is configured to receive a light-emitting control signal and a gate electrode of the initialization transistor is configured to receive the initialization signal; and wherein the light-emitting control signal and the initialization signal are a same signal.

In a second aspect, according to embodiments of the present application, there is provided a display device, which includes the display panel as described above.

BRIEF DESCRIPTION OF THE DRAWINGS

In order to illustrate technical solutions of embodiments of the present application more clearly, the drawings required for the embodiments of the present application will be briefly described. Obviously, the drawings described below are only some embodiments of the present application. For a person skilled in the art, other drawings can also be obtained from these drawings without any inventive effort.

In the drawings:
1. pixel circuit; 2. light-emitting element; EMIT, light-emitting control signal line; EMIT1, first light-emitting control signal line; EMIT2, second light-emitting control signal line; VCC, fixed power signal line; Vref, initialization signal line; DATA, data signal line; Res, reset signal terminal; VDD, the first power signal; VEE, the second power signal; 21, first active layer; 22, second active layer; Gate1, first gate electrode; Gate2, second gate electrode; Gate3, third gate electrode; 30, first load element; T1, first transistor; T2, driving transistor; T3, light-emitting control transistor; T4, initialization transistor; T5, reset transistor; T6, data-writing transistor; T7, compensation transistor; T8, second light-emitting control transistor; Cst1, first energy storage capacitor; and Cst2, second energy storage capacitor.

DETAILED DESCRIPTION

The features and exemplary embodiments of various aspects of the present application will be described in detail below. In order to make the purpose, technical solutions and advantages of the present application more clear, the present application will be further described in detail below with reference to the accompanying drawings and specific embodiments. It should be understood that the specific embodiments described herein are only intended to explain the present application, but not to limit the present application. It will be apparent to a person skilled in the art that the present application may be practiced without some of these specific details. The following description of the embodiments is merely to provide a better understanding of the present application by illustrating examples of the present application.

It should be noted that, in this document, relational terms such as first and second are used only to distinguish one entity or operation from another entity or operation, and do not necessarily require or imply such actual relationship or sequence between these entities or operations. Moreover, the terms "comprising", "including" or any other variation thereof are intended to encompass a non-exclusive inclusion such that a process, method, article or device that includes a list of elements includes not only those elements, but also includes other elements that are not explicitly listed but inherent to such a process, method, article or device. Without further limitation, an element defined by the term "comprising . . . " does not preclude presence of additional elements in a process, method, article or device that includes the element.

It should be noted that the embodiments in the present application and the features of the embodiments may be combined with each other in the case of no conflict. The embodiments will be described in detail below with reference to the accompanying drawings.

At present, a pixel circuit in a display panel is usually provided with a driving transistor, an initialization transistor and a light-emitting control transistor. The driving transistor can provide a driving current for a light-emitting element, the initialization transistor can provide an initialization signal for the light-emitting element when in a non-light-emitting stage, and the light-emitting control transistor can control the light-emitting element to enter a light-emitting stage. That is, among the light-emitting control transistor and the initialization transistor, one is used to initialize a voltage across the light-emitting element, and the other is used to provide a potential difference across the light-emitting element, and thus their functions are not overlapped. That is, when one of them is turned on, the other should be turned off. In related arts, the light-emitting control transistor and the initialization transistor are usually set by the same type of transistors. Therefore, in order to control one of them to be turned on and the other to be turned off, it is necessary to set two different control signals, which leads to an increased number of lines in the display panel.

In order to solve the above-mentioned technical problem of a large number of lines in a display panel, a display panel and a display device are provided according to embodiments of the present application. The display panel according to embodiments of the present application will be first described below.

Figure 1:
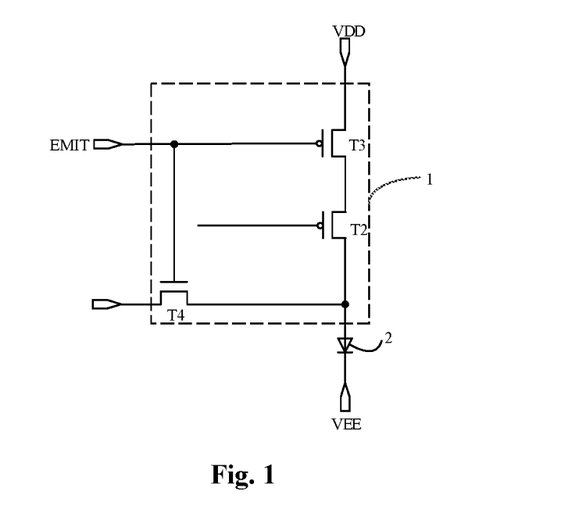
FIG. 1 is a schematic structural diagram of a display panel according to an embodiment of the present application.

FIG. 1 shows a schematic structural diagram of a display panel according to an embodiment of the present application. The display panel includes a pixel circuit 1 and a light-emitting element 2. The pixel circuit 1 includes a driving transistor T2, a light-emitting control transistor T3 and an initialization transistor T4.

The driving transistor T2 can provide a driving current for the light-emitting element 2, the light-emitting control transistor T3 can selectively allow the light-emitting element 2 to enter a light-emitting stage, and the initialization transistor T4 can provide an initialization signal for the light-emitting element 2.

One of the light-emitting control transistor T3 and the initialization transistor T4 is a PMOS transistor, and the other of the light-emitting control transistor T3 and the initialization transistor T4 is an NMOS transistor. A gate electrode of the light-emitting control transistor T3 receives a light-emitting control signal, and a gate electrode of the initialization transistor T4 receives an initialization signal. The light-emitting control signal and the initialization signal are a same signal.

The light-emitting element 2 may be a light-emitting diode (Light-Emitting Diode, LED), organic light-emitting diode (Organic Light-Emitting Diode, OLED), sub-millimeter light-emitting diode (Mini Light-emitting diode, Mini LED), Micro light-emitting diode (Micro Light-emitting diode, LED) or the like.

In an initialization stage, when an initialization signal is received by the gate electrode of the initialization transistor T4, such that the initialization transistor T4 is turned on, so as to provide the initialization signal to the light-emitting element 2 to initialize the light-emitting element 2 before it emits light. At this point, the light-emitting control signal and the initialization signal are a same signal, while the light-emitting control transistor T3 and the initialization transistor T4 are PMOS and NMOS transistors respectively. When the initialization transistor T4 receives the initialization signal and is turned on, the light-emitting control transistor T3 receives the light-emitting control signal at its gate electrode and is turned off.

In a light-emitting stage, the light-emitting control transistor T3 is turned on upon reception of a light-emitting control signal at its gate electrode, and at this point, the initialization transistor T4 receives an initialization signal that is the same as the light-emitting control signal and is turned off. When the light-emitting control transistor T3 is turned on, the driving transistor T2 is turned off, so that the light-emitting element 2 are connected to a first power signal VDD and a second power signal VEE at two terminals thereof respectively, and emits light under driving of a driving current.

In this embodiment, by setting the light-emitting control signal and the initialization signal to be a same signal, and setting the light-emitting control transistor T3 and the initialization transistor T4 to be PMOS and NMOS transistors, respectively, the light-emitting control transistor T3 and the initialization transistor T4 can receive a same control signal, and maintain opposite conduction states, so that both the light-emitting control transistor T3 and the initialization transistor T4 can be controlled by the same signal. The light-emitting control signal line EMIT and the initialization signal line Vref in the pixel circuit I can use a same line for signal transmission, so that the number of lines of the light-emitting control signal line EMIT and the initialization signal line Vref is only half of existing number of lines. In a case where the display panel includes a plurality of pixel circuits 1 and a plurality light-emitting elements 2, a large number of initialization signal lines Vref or light-emitting control signal lines EMIT can be saved, thereby simplifying a structure and improving resolution pixels per inch (Pixels Per Inch, PPI) of the display panel. In addition, signal generation of existing light-emitting control signal lines and initialization signal lines requires different signal driving circuits and the signal driving circuits are usually set in a frame area outside a display area of the display panel. By setting the light-emitting control signal line and the initialization signal line as a same line, the number of existing signal driving circuits can be reduced in half, thereby simplifying a structure of the signal driving circuits. Reduction of the number of signal driving circuits in the frame area is also helpful to reduce a thickness of the frame area.

In some embodiments, the display panel may further include a light-emitting control signal line EMIT for providing the light-emitting control signal, wherein the light-emitting control signal line EMIT is connected to the gate electrode of the light-emitting control transistor T3, and is also connected to the gate electrode of the initialization transistor T4.

In the pixel circuit 1, the gate electrode of the light-emitting control transistor T3 and the gate electrode of the initialization transistor T4 are connected to a same light-emitting control signal line EMIT, so the light-emitting control signal and the initialization signal can be transmitted through a single line extending from a frame area to a display area, thereby reducing the number of lines in the display panel and simplifying a structure of the panel.

Figure 2:
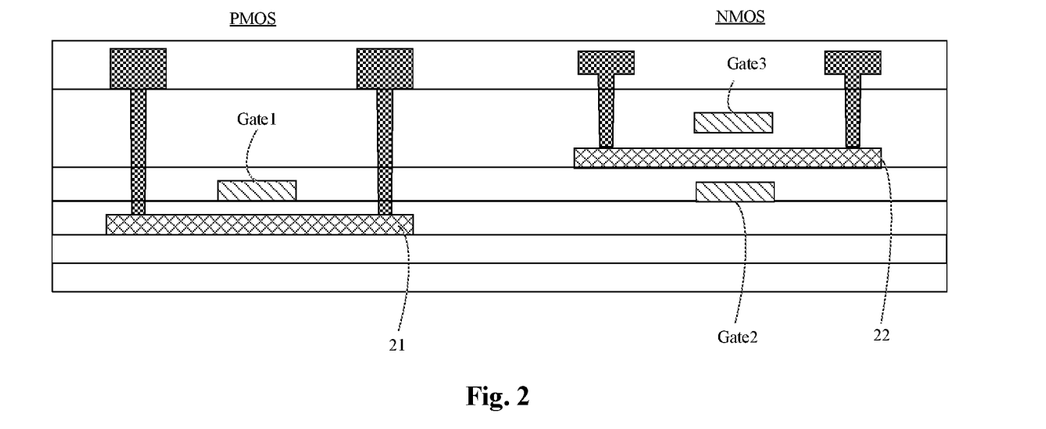
FIG. 2 is a schematic structural diagram of a PMOS transistor and an NMOS transistor according to an embodiment of the present application.

In some embodiments, one of the light-emitting control transistor T3 and the initialization transistor T4 may be a PMOS transistor, and the other of the light-emitting control transistor T3 and the initialization transistor T4 may be an NMOS transistor. Referring to FIG. 2, the PMOS transistor may include a first gate electrode Gate1 and a first active layer 21. The NMOS transistor may include a second gate electrode Gate2, a third gate electrode Gate3 and a second active layer 22, wherein the second gate electrode Gate2 and the third gate electrode Gate3 may be located on respective sides of the second active layer 22. That is, the PMOS transistor includes one gate electrode, the NMOS transistor includes two gate electrodes, and the two gate electrodes of the NMOS transistor are located on a layer over the second active layer 22 and a layer under the second active layer 22, respectively.

Figure 3:
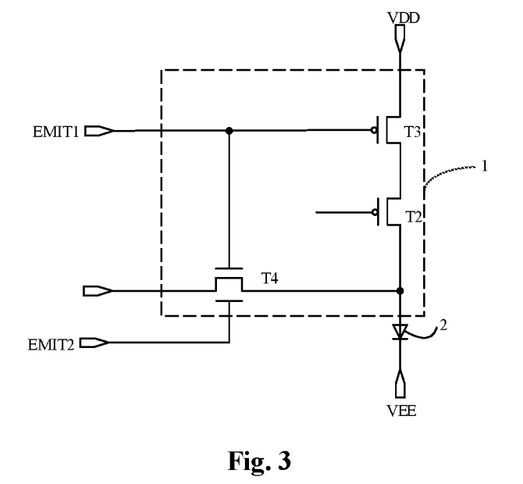
FIG. 3 is a schematic structural diagram of a display panel according to another embodiment of the present application.

Referring to FIG. 3, the display panel may further include a light-emitting control signal line EMIT for providing the light-emitting control signal, wherein the light-emitting control signal line EMIT includes a first light-emitting control signal line EMIT1 and a second light-emitting control signal line EMIT2, the first light-emitting control signal line EMIT1 may be connected to both of the first gate electrode and the second gate electrode, or may be connected to the first gate electrode or the second gate electrode independently, and the second light-emitting control signal line EMIT2 is connected to the third gate electrode. The first emission control signal line EMIT1 provides a first light-emitting control signal for the first gate electrode or the second gate electrode, and the second light-emitting control signal line EMIT2 provides a second light-emitting control signal for the third gate electrode.

Referring to both the FIG. 2 and FIG. 3, the light-emitting control transistor T3 being a PMOS transistor and the initialization transistor T4 being an NMOS transistor is taken as an example for illustration. An NMOS transistor in a display panel is usually an oxide semiconductor transistor, and a PMOS transistors is usually a low temperature polysilicon transistors. An oxide semiconductor transistor generally include two gate electrodes, i.e. a top gate electrode and a bottom gate electrode. A low temperature polysilicon transistor includes one gate electrode. As shown in FIG. 2, the first gate electrode Gate1 is the gate electrode of the low temperature polysilicon transistor. The second gate electrode Gate2 is the bottom gate electrode of the oxide semiconductor transistor, and the third gate electrode Gate3 is the top gate of the oxide semiconductor transistor. Therefore, in an existing display panel, for the light-emitting control transistor T3 and the initialization transistor T4 in the pixel circuit 1, it is usually necessary to set three lines for being connected to the three gate electrodes of the transistors respectively. The first light-emitting control signal line EMIT1 provides a corresponding signal for the gate electrode of the PMOS transistor and one of the gate electrodes of the NMOS transistor, and the second light-emitting control signal line EMIT2 provides a corresponding signal for the other of the gate electrodes of the NMOS transistor. Since signals can be provided for the three gate electrodes through two light-emitting control signal lines EMIT, the number of lines can be reduced and a structure of the panel can be simplified.

The oxide semiconductor transistor may be an indium gallium zinc oxide (Indium Gallium Zinc Oxide, IGZO) transistor.

It should be understood that the two gate electrodes of the NMOS transistor are the top gate electrode and the bottom gate electrode respectively, and the first light-emitting control line is connected to the bottom gate electrode of the NMOS transistor, and the second light-emitting control line is connected to the top gate electrode of the NMOS transistor.

In some embodiments, the first gate electrode of the PMOS transistor and the second gate electrode of the NMOS transistor may be located in a same layer, and the first light-emitting control signal line EMIT1 is connected to both the first gate electrode and the second gate electrode in the same layer.

In the case where the first gate electrode and the second gate electrode are located in a same metal layer, the first light-emitting control signal line EMIT1 may be provided in the same metal layer as the first gate electrode and the second gate electrode, and is electrically connected to both the first gate electrode and the second gate electrode.

Among the two gate electrodes of the NMOS transistor, if one of the gate electrodes is located in a same metal layer as the gate electrode of the PMOS transistor, the first light-emitting control signal line EMIT1 can be provided in the same metal layer and is connected to both the two gate electrodes, thereby a wiring structure of the display panel can be simplified.

It should be understood that, among the two gate electrodes of the NMOS transistor, the gate electrode of the NMOS transistor that is located in the same metal layer as the gate electrode of the PMOS transistor is usually the bottom gate of the NMOS transistor.

In some embodiments, the first gate electrode of the PMOS transistor and the second gate electrode of the NMOS transistor may be located in different layers, and the first light-emitting control signal line EMIT1 may be provided in a same layer as the first gate electrode, or may be provided in a same layer as the second gate electrode.

In the case where the first light-emitting control signal line EMIT1 is provided in a same layer as the first gate electrode, the first light-emitting control signal line EMIT1 is connected to the first gate electrode within the same layer, and is connected to the second gate electrode through a via connecting the metal layer where the first gate electrode is located to a metal layer where the second gate electrode is located.

Similarly, in the case where the first light-emitting control signal line EMIT1 is located in a same layer as the second gate electrode, the first light-emitting control signal line EMIT1 is connected the second gate electrode within the same layer, and is connected to the first gate electrode through a via connecting the metal layer where the second gate electrode is located and a metal layer where the first gate electrode is located.

Figure 4:
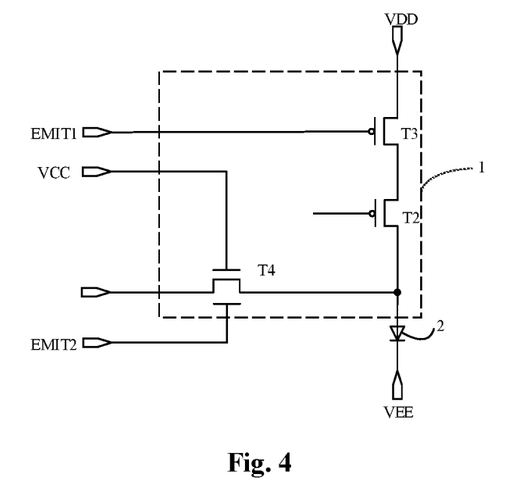
FIG. 4 is a schematic structural diagram of a display panel according to another embodiment of the present application.

Referring to FIG. 4, in some embodiments, the first light-emitting control signal line EMIT1 is connected to the first gate electrode, and the second light-emitting control signal line EMIT2 is connected to the third gate electrode. The second gate electrode is connected to a fixed power signal line VCC to receive a fixed power signal provided by the fixed power signal line VCC. The first light-emitting control signal line EMIT1 and the second light-emitting control signal line EMIT2 transmit a same light-emitting control signal.

In this embodiment, the two light-emitting control signal lines EMIT are connected to the first gate electrode and the third gate electrode respectively, and the second gate electrode is connected to a fixed power signal line VCC. Since a fixed power signal line VCC is a line capable of providing a fixed power supply signal and already set in a display panel, the NMOS transistor in each pixel circuit 1, which functions as the light-emitting control transistor T3 or the initialization transistor T4, can have the second gate electrode connected to a closest fixed power signal line VCC to receive a fixed power signal.

It should be understood that a length of a line connecting the second gate electrode and the fixed power signal line VCC is much smaller than a length of a line extending from a frame area to a display area of the display panel and connected to the second gate electrode. That is, since the second gate electrode is connected to a fixed power signal line VCC, a length of a signal line can be reduced, and a structure of the panel can be simplified.

In some embodiments, the display panel may include a first driving circuit for providing the light-emitting control signal to the pixel circuit 1, and the light-emitting control signal line EMIT is connected to an output terminal of the first driving circuit. The first light-emitting control signal line EMIT1 may also be connected to the second light-emitting control signal line EMIT2 through a first via, and the first via is provided between the first driving circuit and a display area of the display panel.

The first driving circuit may be provided in a frame area of the display panel, and outputs the light-emitting control signal to the first light-emitting control line. The first light-emitting control line is connected to the second light-emitting control signal line EMIT2 through the first via before display is performed, such that both of the two light-emitting signal lines transmit the same light-emitting control signal at the same time, thereby realizing transmission of two signals through a single driving circuit, and thus the number of driving circuits can be reduced, a length of the second light-emitting control line can be reduced, the number of driving circuits within the frame area of the display panel can be reduced, and a structure of the driving circuit can be simplified.

In some embodiments, the light-emitting control transistor T3 may be the PMOS transistor, and the initialization transistor T4 may be the NMOS transistor.

An NMOS transistor is usually an oxide semiconductor transistor, such as IGZO transistor. An oxide semiconductor transistor has a lower leakage current than a low temperature polysilicon transistor. In the case where the initialization transistor T4 is the NMOS transistor, it can be ensured that no leakage current will be generated when the initialization transistor T4 is turned off. That is, by setting the initializing transistor T4 as the NMOS transistor, it can prevent a leakage current generated by the initializing transistor T4 f during the light-emitting stage from affecting the driving current for the light-emitting element 2.

In some embodiments, an electrical conductivity of the first light-emitting control signal line EMIT1 may be set to be smaller than an electrical conductivity of the second light-emitting control signal line EMIT2.

The first light-emitting control signal line EMIT1 is connected to the gate electrode of the PMOS transistor and the bottom gate electrode of the NMOS transistor, and the second light-emitting control signal line EMIT2 is connected to the top gate electrode of the NMOS transistor.

In the initialization stage, the first light-emitting control signal line EMIT1 transmits a first light-emitting control signal, the second light-emitting control signal line EMIT2 transmits a second light-emitting control signal. The light-emitting control transistor T3 receives the first light-emitting control signal and is turned off, and the initialization transistor T4 receive the first light-emitting control signal and the second light-emitting control signal at its two gate electrodes respectively and is turned on.

In the light-emitting stage, in order to prevent the light-emitting control transistor T3 and the initialization transistor T4 from being turned on at the same time, which affects normal light-emitting of the light-emitting element 2 and causes hysteresis of the display screen, it is necessary to control the initialization transistor T4 to be turned off before the light-emitting control transistor T3 is turned on. By setting the electrical conductivity of the first light-emitting control signal line EMIT1 to be smaller than the electrical conductivity of the second light-emitting control signal line EMIT2, when the light-emitting control signals are inverted, one gate electrode of the initialization transistor T4 can first receive an inverted second light-emitting control signal such that the initialization transistor T4 is controlled to be switched from a turned-on state to a turned-off state, and then the gate electrode of the light-emitting control transistor T3 and the other gate electrode of the initialization transistor T4 receive an inverted first light-emitting control signal such that the light-emitting control transistor T3 is turned on after the initialization transistor T4 has been turned off. By adjusting the electrical conductivity of each of the two light-emitting control signal lines EMIT, a slight hysteresis can be provided between reception of the two signals by the two transistors respectively, thereby avoiding a hysteresis phenomenon of a displayed picture otherwise caused by simultaneous turned-on of the two transistors.

In some embodiments, a width of the first light-emitting control signal line EMIT1 may be set to be smaller than a width of the second light-emitting control signal line EMIT2.

Similar to the preceding embodiment, in order to ensure the light-emitting control transistor T3 is turned on after the initialization transistor T4 has been turned off, the width of the first light-emitting control signal line EMIT1 is set to be smaller than that of the second light-emitting control signal line EMIT2, so that a resistance of the first light-emitting control signal line EMIT1 is greater than a resistance of the second light-emitting control signal line EMIT2. When both of the two light-emitting control signals are inverted, the first light-emitting control signal has a certain signal hysteresis compared with the second light-emitting control signal due to its smaller width and greater resistance, such that the light-emitting control transistor T3 receives the first light-emitting control signal and is turned on after a delay, thereby avoiding a hysteresis phenomenon of a displayed picture otherwise caused by simultaneous turned-on of the two transistors.

The resistance of the first light-emitting control signal line EMIT1 can be made greater than the resistance of the second light-emitting control signal line EMIT2 by setting the length of the first light-emitting control signal line EMIT1 to be greater than the length of the second light-emitting control signal line EMIT2, so that the first light-emitting control signal has a signal hysteresis compared with the second light-emitting control signal, and thus the light-emitting control transistor T3 can be turned on after a delay.

It should be understood that the setting of the length and width of the light-emitting control signal lines EMIT to adjust their resistance may be used separately or in combination. For example, the light-emitting control signal line EMIT1 may be set with a smaller line width and a longer length than the second light-emitting control signal line EMIT2.

Figure 5:
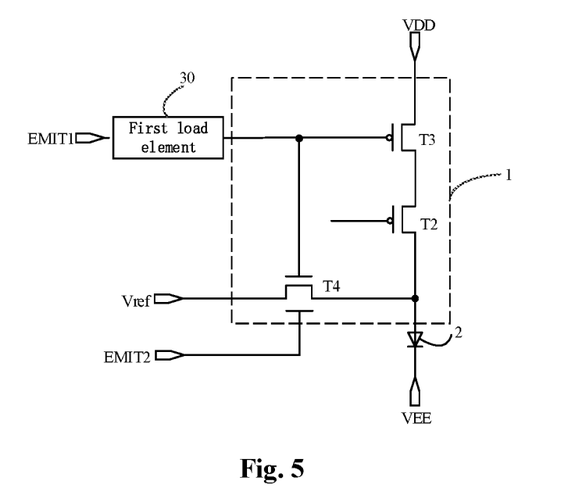
FIG. 5 is a schematic structural diagram of a display panel according to another embodiment of the present application.

Referring to FIG. 5, in some embodiments, a first load element 30 may be connected to the first light-emitting control signal line EMIT1, to adjust a load difference between the first light-emitting control signal line EMIT1 and the second light-emitting control signal line EMIT2.

In the case where the line width and length of the first light-emitting control signal line EMIT1 are the same as those of the second light-emitting control signal line EMIT2, by providing the first load element 30 on the first light-emitting control signal line EMIT1, the resistance of the first light-emitting control signal line EMIT1 can be raised, so that when the two light-emitting control signal lines EMIT transmit the same signal, there is a signal hysteresis for the light-emitting control transistor T3 to receive the first light-emitting control signal, and thus the light-emitting control transistor T3 is turned on after a delay.

It should be understood that, in the case where the line width and length of the two light-emitting control signal lines EMIT are the same, a load difference between the two light-emitting control signal lines EMIT can be adjusted by setting the first load element 30, thereby realizing a signal hysteresis on the first light-emitting control signal EMIT1. In the case where the line width or length of the two light-emitting control signal lines EMIT are different, it is also possible to set the first load element 30 to adjust their equivalent total resistances of respective light-emitting control signal lines EMIT. That is, the setting of the first load element 30, adjustment of the line width and adjustment of the length may be used alone or in combination.

In some embodiments, the first load element 30 may be a capacitive element or a resistive element.

By setting a capacitive element or a resistive element, it can be realized that the first light-emitting control signal on the first light-emitting control signal line EMIT1 has a certain signal hysteresis compared with the second light-emitting control signal on the second light-emitting control line, and thus the light-emitting control transistor T3 can be turned on after the initialization transistor T4 has been turned off.

Figure 6:
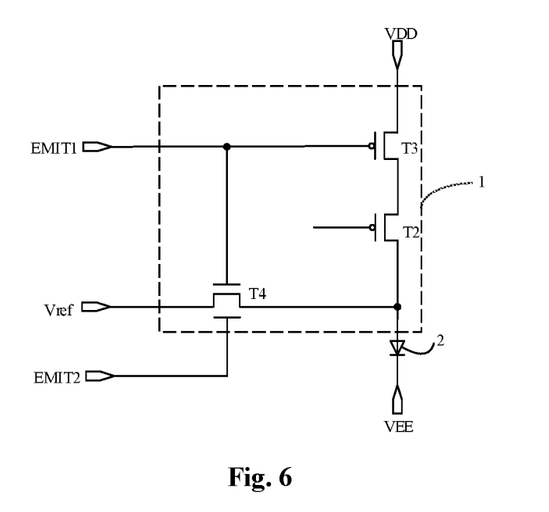
FIG. 6 is a schematic structural diagram of a display panel according to by still another embodiment of the present application.

Referring to FIG. 6, in some embodiments, the display panel may further include an initialization signal line Vref for transmitting the initialization signal. That is, the display panel may include the first light-emitting control signal line EMIT1, the second light-emitting control signal line EMIT2 as well as the initialization signal line Vref.

In the case where the three signal lines are respectively orthographically projected onto a plane parallel to a surface of the display panel, a distance between the first light-emitting control signal line EMIT1 and the initialization signal line Vref is greater than a distance between the second light-emitting control signal line EMIT2 and the initialization signal line Vref.

The first light-emitting control signal line EMIT1, the second light-emitting control signal line EMIT2 and the initialization signal line Vref may be extended from a frame area of the display panel to a display area of the display panel in a same direction. The first light-emitting control signal line EMIT1 is connected to the first gate electrode and the second gate electrode, the second light-emitting control signal line EMIT2 is connected to the third gate electrode, and the initialization signal line Vref is connected to a source electrode of the initialization transistor T4.

In the case where the initialization transistor T4 is the NMOS transistor and has the two gate electrodes, the third gate electrode may be a main gate electrode of the initialization transistor T4, and the second gate electrode may be a slave gate of the initialization transistor T4. In the case where the second light-emitting control signal line EMIT2 is further away from the initialization signal line Vref, one of the two signal lines is directly extended and connected to the main gate electrode or the source electrode of the initialization transistor T4, while an additional line is required to connect the other to the main gate electrode or the source electrode of the initialization transistor T4 due to its further distance. By setting the second light-emitting control signal line EMIT2 is more close to the initialization signal line Vref, the two signal lines can be connected to the main gate electrode or the source electrode of the initialization transistor T4 without additional wirings or crossings.

In some embodiments, the first light-emitting control signal line EMIT1 may be extended in a same direction as the second light-emitting control signal line EMIT2, and the first light-emitting control signal line EMIT1 and the second light-emitting control signal line EMIT2 may be at least partially overlapped with each other.

Both the first light-emitting control signal line EMIT1 and the second light-emitting control signal line EMIT2 are extended from the frame area of the display panel to the display area of the display panel and are connected to the gate electrode of the light-emitting control transistor T3 and the gate electrode of the initialization transistor T4, respectively. Since the two light-emitting control signal lines EMIT transmit the same signal, no parasitic capacitance will be generated even if the two light-emitting control signal lines are set to be extend in a same direction and partially overlapped. That is, by setting the two light-emitting control signal lines EMIT to be extended in a same direction and partially overlapped, the line width is made to be smaller than that of two different signal lines, thereby reducing a space occupied by the lines.

Figure 7:
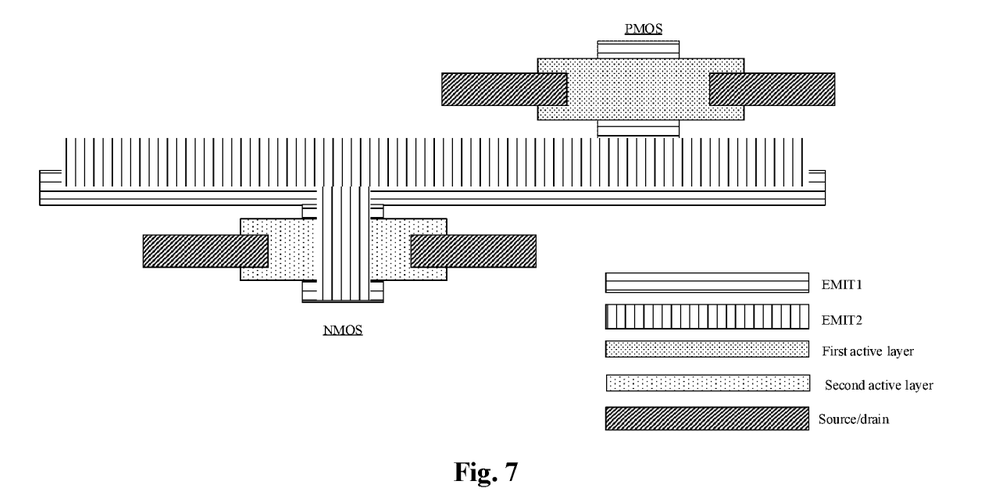
FIG. 7 is a schematic diagram of a first light-emitting control signal line, a second light-emitting control signal line, and various lines of the transistors according to an embodiment of the present application.

Referring to FIG. 7, for the NMOS transistor, two sides of the second active layer are connected to a source electrode and a drain electrode respectively, and the first light-emitting control signal line EMIT1 is located above the second active layer when extending into the display area. That is, when being orthographically projected onto a substrate of the display panel, the first light-emitting control signal line EMIT1 is closer to the substrate of the display panel than the second active layer. The second light-emitting control signal line EMT2 is located under the first active layer when extending into the display area. That is, when being orthographically projected onto the substrate of the display panel, the second light-emitting control signal line EMT2 is farther from the substrate of the display panel than the first active layer.

The width of the first light-emitting control signal line EMIT1 may be set to be smaller than that of the second light-emitting control signal line EMIT2. Alternatively, the length of the first light-emitting control signal line EMIT1 may be set to be greater than the length of the second light-emitting control signal line EMIT2. So, the first light-emitting control signal has a signal hysteresis with respect to the second lighting control signal.

As shown in FIG. 7, since the first light-emitting control signal line EMIT1 and the second light-emitting control signal line EMIT2 transmit the same signal, the first light-emitting control signal line EMIT1 and the second light-emitting control signal line EMIT2 may be set to be extended in a same direction within the display area, and the first light-emitting control signal line EMIT1 and the second light-emitting control signal line EMIT2 may be at least partially overlapped, so that a space occupied by the lines can be reduced.

For the PMOS transistor, the first light-emitting control signal line EMIT1 may be extended under the first active layer and connected to the first active layer through a via.

For the NMOS transistors, the first light-emitting control signal line EMIT1 may be extended under the second active layer and connected to the second active layer through a via; and the second light-emitting control signal line EMIT2 may be extended above the second active layer and connected to the second active layer through a via.

In some embodiments, one of the light-emitting control transistor T3 and the initialization transistor T4 is the PMOS transistor, and the other is the NMOS transistor. The PMOS transistor may include the first gate electrode and the first active layer. The NMOS transistor may include the second gate electrode, the third gate electrode and the second active layer, and the second gate electrode and the third gate electrode are provided at respective sides of the second active layer. That is, the PMOS transistor includes one gate electrode, and the NMOS transistor includes two gate electrodes.

The display panel may further include a light-emitting control signal line EMIT for providing the light-emitting control signal, and the first gate electrode of the PMOS transistor, the second gate electrode of the NMOS transistor and the light-emitting control signal line EMIT may be set in a same layer, that is, they may be located in a same metal layer, and the first gate electrode, the second gate electrode and the light emitting control signal line EMIT are connected with each other. The third gate electrode of the NMOS transistor is connected to a fixed power signal line VCC to receive a fixed power signal.

The first gate electrode and the second gate electrode may receive a same light-emitting control signal when the first gate electrode, the second gate electrode and the light emitting control signal line EMIT are connected with each other, while the third gate electrode may receive a fixed power signal. The second gate electrode of the NMOS transistor is its bottom gate, and the third gate electrode is its top gate. In the case where the second gate electrode is set as a master gate electrode and the third gate electrode is set as a slave gate electrode, the master gate electrode receives a same light-emitting control signal as the first gate electrode, and the slave gate electrode receives a fixed power signal.

It should be understood that, in an NMOS transistor, the oxide semiconductor transistor usually includes a top gate electrode and a bottom gate electrode, and the two gate electrode s are located at respective sides of an active layer, and an insulating layer is provided between each of the two gate electrodes and the active layer. In the case where a thickness of an insulating layer between the bottom gate electrode and the active layer is greater than a thickness of an insulating layer between the top gate electrode and the active layer, the bottom gate electrode is a master gate electrode and the top gate electrode is a slave gate electrode. Similarly, in the case where a thickness of an insulating layer between the top gate electrode and the active layer is greater than a thickness of an insulating layer between the bottom gate electrode and the active layer, the top gate electrode is a master gate electrode and the bottom gate electrode is a slave gate electrode.

Figure 8:
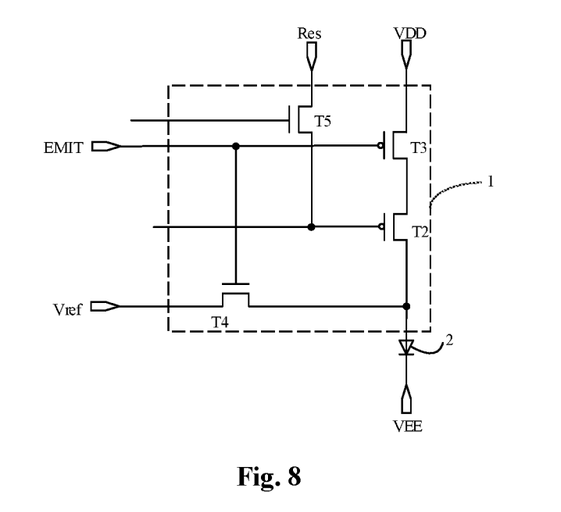
FIG. 8 is a schematic structural diagram of a display panel according to still another embodiment of the present application.

Referring to FIG. 8, in some embodiments, the pixel circuit 1 may further include a reset transistor T5, two terminals of which are connected to a reset signal terminal Res and a gate of the driving transistor T2 respectively, and the reset transistor T5 can provides a reset signal to the gate of the driving transistor T2.

When the reset transistor T5 is turned on, a reset signal output by the reset signal terminal Res may be provided to the gate of the driving transistor T2 so that a potential of the gate of the driving transistor T2 is reset to a voltage of the reset signal, and a turned-on state of the drive transistor T2 is controlled by the reset signal.

Figure 9:
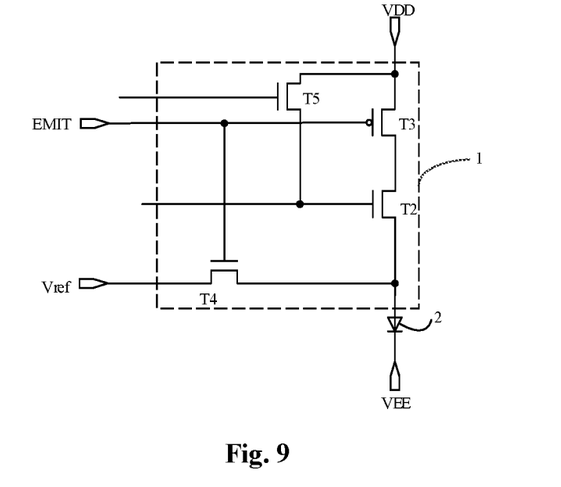
FIG. 9 is a schematic structural diagram of a display panel according to still another embodiment of the present application.

In this embodiment, the driving transistor T2 is a PMOS transistor, and the reset signal may be a low level signal. Referring to FIG. 9, in the case where the driving transistor T2 is an NMOS transistor, the light-emitting control transistor T3 receives a first power signal VDD, which is a high-level signal, so as to provide a high-level signal for the light-emitting element 2 when in the light-emitting stage. Because the driving transistor T2 is an NMOS transistor and the reset signal is a high-level signal, the first power signal VDD may be reused as the reset signal, and the first power signal VDD will be provided to the gate electrode of the driving transistor T2 when the reset transistor T5 is turned on.

Figure 10:
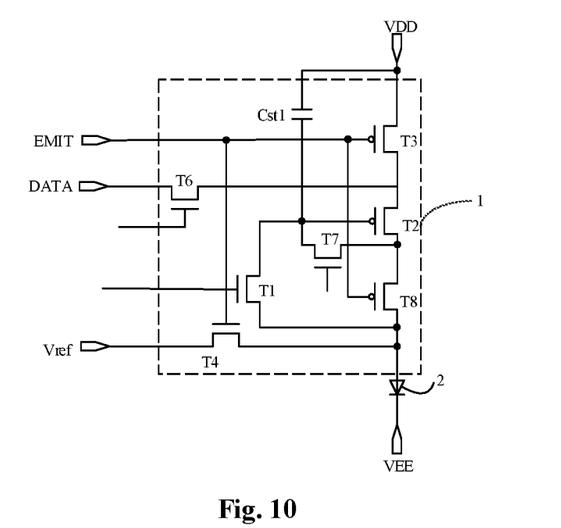
FIG. 10 is a schematic structural diagram of a display panel according to still another embodiment of the present application.

Referring to FIG. 10, in some embodiments, the display panel may further include a data-writing transistor T6 and a first transistor T1. One terminal of the data-writing transistor T6 is connected to a first electrode of the driving transistor T2, and the other terminal of the data-writing transistor T6 is connected to a data signal line DATA. The data-writing transistor T6 can provide a data signal to a gate electrode of the driving transistor T2. One terminal of the first transistor T1 is connected to a second electrode or the gate electrode of the driving transistor T2, and the other terminal of the first transistor T1 is connected to the light-emitting element 2.

It should be understood that, in order to enable the pixel structure 1 to operate normally, it is necessary to set a first energy storage capacitor Cst1. One terminal of the first energy storage capacitor Cst1 is connected to the first power signal VDD, and the other terminal is connected to the gate electrode of the driving transistor T2. The first energy storage capacitor Cst1 can store energy when a data signal is written into the gate electrode of the driving transistor T2, and can release stored charges when the data-writing transistor T6 is turned off, so as to keep the driving transistor T2 turned on.

During at least a part of a preceding stage of at least one frame, the first transistor T1 and the initialization transistor T4 may be both in a turned-on state, to enable the initialization signal to be written into the gate electrode of the driving transistor T2.

When the initialization transistor T4 is turned on, the initialization signal can be written into the light-emitting element 2, and when the first transistor T1 is turned on, one terminal of the first transistor T1 is connected to the light-emitting element 2 and the other terminal may be directly or indirectly connected to the gate electrode of the driving transistor T2, so that the initialization signal can be written into the gate electrode of the driving transistor T2 through the first transistor T1, and thus the gate electrode of the driving transistor T2 and the light-emitting element 2 can be initialized at the same time.

Figure 11:
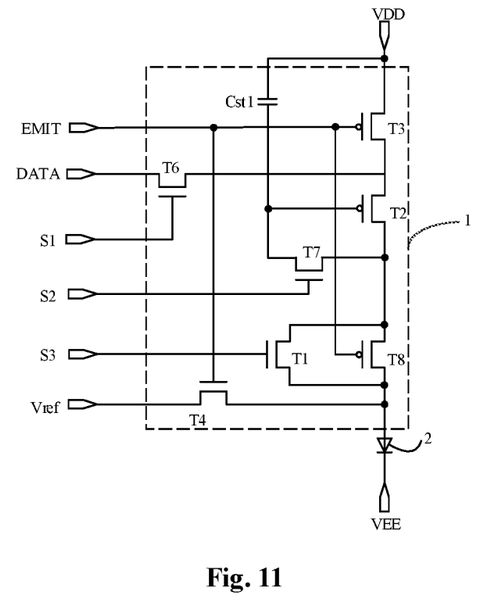
FIG. 11 is a schematic structural diagram of a display panel according to still another embodiment of the present application.

Referring to FIG. 11, in some embodiments, one terminal of the first transistor T1 is connected to the light-emitting element 2, and the other terminal of the first transistor T1 is connected to the second electrode of the driving transistor T2. The pixel circuit 1 may further includes a compensation transistor T7, and two terminals of the compensation transistor T7 are connected to the gate electrode of the driving transistor T2 and the second electrode of the driving transistor T2 respectively. During at least a part of a preceding stage of at least one frame, all of the first transistor T1, the initialization transistor T4 and the compensation transistor T7 are in a turned-on state, so that the first transistor T1 can write the initialization signal to the second electrode of the driving transistor T2, and the compensation transistor T7 can write the initialization signal into the gate electrode of the driving transistor T2.

Please continue to refer to FIG. 11, in some embodiments, the gate electrode of the driving transistor T2 may be initialized and reset by being written with an initialization signal, and a first energy storage capacitor Cst1 may be set between the gate electrode of the driving transistor T2 and the first power signal VDD, so that energy can be stored by the first energy storage capacitor Cst1 when a data signal is written into the gate electrode of the driving transistor T2.

Figure 12:
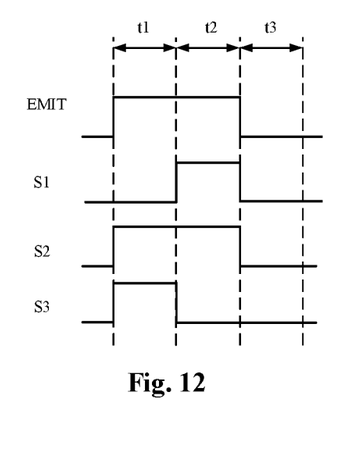
FIG. 12 is a signal timing diagram corresponding to the embodiment of FIG. 11.

Referring to both FIG. 11 and FIGS. 12, t1, t2, and t3 in FIG. 12 represent an initialization stage, a data-writing stage and a light-emitting stage, respectively.

In the initialization stage, the light-emitting control transistor T3, the second light-emitting control transistor T8 and the initialization transistor T4 receive a same light-emitting control signal, so that the light-emitting control transistor T3 and the second light-emitting control transistor T8 are turned off and the initialization transistor T4 is turned on, so as to write an initialization signal into an anode of the light-emitting element 2. The first transistor T1 and the compensation transistor T7 are also turned on, so as to write the initialization signal into the gate electrode of the driving transistor T2 through the first transistor T1 and the compensation transistor T7. Thus, initialization of the light-emitting element 2 and the gate electrode of the driving transistor T2 is realized.

In the data-writing stage, the data-writing transistor T6 is turned on and the first transistor T1 is turned off. At this point, a data signal is written into the gate electrode of the driving transistor T2 after passing through the data-writing transistor T6, the driving transistor T2 and the compensation transistor T7, and the first energy storage capacitor Cst1 is charged so that the first energy storage capacitor Cst1 performs charge storage.

In the light-emitting stage, the light-emitting control signals are inverted. At this point, the two light-emitting control transistors are turned on, the initialization transistor T4 is turned off, the first transistor T1 and the compensation transistor T7 are turned off, and the first energy storage capacitor Cst1 releases stored charges, so that the gate electrode of the driving transistor T2 receives a voltage which is the same as the data signal and remains turned-on, and the first power signal VDD is written into the light-emitting element 2 through the light-emitting control transistor T3, the driving transistor T2 and the second light-emitting control transistor T8 in the order, to enable the light-emitting element 2 to emit light.

It should be noted that, in the above embodiment, each of the driving transistor T2, the compensation transistor T7, the initialization transistor T4 and the data-writing transistor T6 may be set as an oxide semiconductor transistor, such as an IGZO transistor. The IGZO transistor is able to reduce a leakage current, thereby preventing a leakage current generated by the transistor from affecting normal light-emitting of the light-emitting element 2 and ensuring display uniformity of the display panel.

In some embodiments, the anode of the light-emitting element 2 may be provided with an initialization signal by the initialization transistor T4. In order to prevent a leakage current generated by the transistor from causing a change in a potential of the anode of the light-emitting element 2, the initialization transistor T4 may be set as an IGZO transistor. In order for the gate electrode of the driving transistor T2 to be connected to the initialization signal through the compensation transistor T7, the first transistor T1 and the initialization transistor T4, at least one of the compensation transistor T7, the first transistor T1 and the initialization transistor T4 may be set to be an oxide semiconductor transistor to reduce a leakage current in the current loop.

It should be understood that the compensation transistor T7 may connect the second electrode of the driving transistor T2 to the gate electrode of the driving transistor T2, and the compensation transistor T7 may be set as an oxide semiconductor transistor in order to avoid a leakage current generated by the transistor from affecting a potential of the gate electrode of the driving transistor T2. In this case, a leakage current may be limited by the compensation transistor T7 no matter whether it is within the driving transistor T2 or between the driving transistor T2 and the light-emitting element 2, so the first transistor T1 may be set as a low-temperature polysilicon LTPS transistor, thereby a space occupied by the panel can be saved and resolution PPI of the display panel can be increased.

Figure 13:
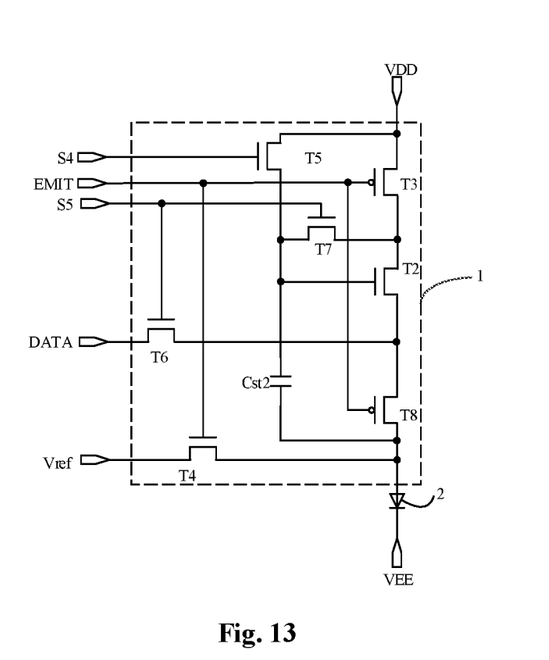
FIG. 13 is a schematic structural diagram of a display panel according to still another embodiment of the present application.

Referring to FIG. 13, in some embodiments, a potential of the gate electrode of the driving transistor T2 may be compensated by setting a second energy storage capacitor Cst2, wherein the second energy storage capacitor Cst2 is provided between the gate electrode of the driving transistor T2 and the anode of the light-emitting element 2.

Figure 14:
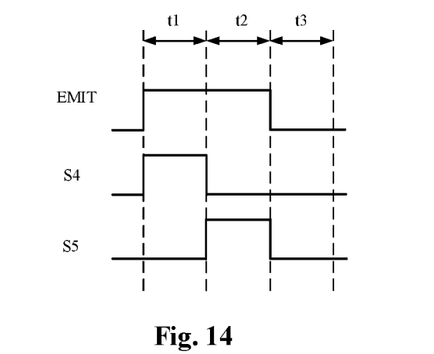
FIG. 14 is a signal timing diagram corresponding to the embodiment of FIG. 13.

Referring to both FIG. 13 and FIGS. 14, t1, t2, and t3 in FIG. 14 represent an initialization stage, a data-writing stage, and a light-emitting stage, respectively.

In the initialization stage, the light-emitting control transistor T3, the second light-emitting control transistor T8 and the initialization transistor T4 receive a same light-emitting control signal, such that the light-emitting control transistor T3, the second light-emitting control transistor T8 are turned off and the initialization transistor T4 is turned on, so as to write an initialization into the anode of the light-emitting element 2. The reset transistor T5 is also turned on, so as to write a first power signal VDD into a first terminal of the second energy storage capacitor Cst2. At this point, the first terminal of the second energy storage capacitor Cst2 is at a voltage of VDD, and a second terminal thereof is at a voltage of Vref.

In the data-writing stage, the reset transistor T5 is turned off and the data writing transistor T6 and the compensation transistor T7 are turned on, so as to write a data signal into the gate electrode of the driving transistor T2 through the data-writing transistor T6, the driving transistor T2 and the compensation transistor T7. At this point, the voltage at the first terminal of the second energy storage capacitor Cst2 becomes Vdata+Vth. Vdata represents a voltage of the data signal, and Vth represents a threshold voltage of the driving transistor T2. It should be understood that, at this point, the voltage at the second terminal of the second energy storage capacitor Cst2 has not been changed, and is still Vref.

In the light-emitting stage, the light-emitting control signals are inverted. At this point, the two light-emitting control transistors are turned on, the initialization transistor T4 is turned off, such that the potential at the anode of the light-emitting element 2 is raised from Vref to Voled, and under coupling of the second energy storage capacitor Cst2, the voltage at the first terminal of the second energy storage capacitor Cst2 is raised from Vdata+Vth to Voled−Vref+Vdata+Vth.

In the light-emitting phase, a driving current flowing through the driving transistor T2 may be calculated by the following formula:

$$I=K(Vgs-Vth)^2$$

$$=K*[(Voled-Vref+Vdata+Vth)-Voled-Vth]^2$$

$$=K*(Vdata-Vref)^2;$$

That is, the driving current of the driving transistor T2 is ultimately only related to magnitude of voltages of the data signal and the initialization signal and has nothing to do with the threshold voltage Vth of the driving transistor T2 and magnitude of the first power signal VDD, thereby avoiding a change in the driving current caused by an influence of an IR voltage drop on the voltage at the gate of the driving transistor T2, and ensuring stability of the driving current and display uniformity of the display panel.

In the above embodiment, each of the driving transistor T2, the compensation transistor T7, the initialization transistor T4, the reset transistor T5 and the data-writing transistor T6 may be set as an oxide semiconductor transistor, such as an IGZO transistor. The IGZO transistor is able to reduce a leakage current, thereby preventing the leakage current generated by the transistor from affecting normal light-emitting of the light-emitting element 2 and ensuring display uniformity of the display panel.

Figure 15:
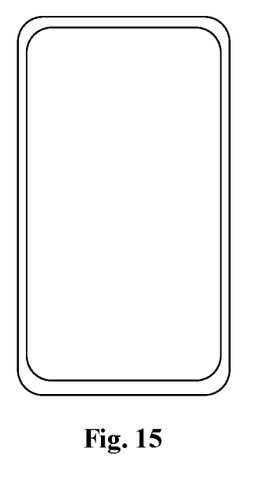
FIG. 15 is a schematic structural diagram of a display device according to an embodiment of the present application.

The embodiments of the present application further provides a display device, see FIG. 15, which may be a PC, a TV, a monitor, a mobile terminal, a tablet computer, a wearable device, etc., and may include the display panel provided according to the embodiments of the present application.

The functional blocks shown in the above-described structural block diagrams may be implemented as hardware, software, firmware, or a combination thereof. When implemented in hardware, it may be, for example, an electronic circuit, an application specific integrated circuit (ASIC), suitable firmware, a plug-in, a function card, or the like. When implemented in software, those elements of the present application are programs or code segments used to perform the required tasks. The program or code segments may be stored in a machine-readable medium or transmitted over a transmission medium or communication link by a data signal carried in a carrier wave. A "machine-readable medium" may include any medium that can store or transmit information. Examples of the machine-readable medium may include an electronic circuit, semiconductor memory device, ROM, flash memory, erasable ROM (EROM), floppy disk, CD-ROM, optical disk, hard disk, fiber optic medium, radio frequency (RF) link, and the like. The code segment may be downloaded via a computer network such as the Internet, an intranet, or the like.

The display panel and the display device provided according to embodiments of the present application is able to enable the light-emitting control transistor and the initialization transistor to receive a same control signal while being opposite conduction states by setting the light-emitting control signal and the initialization signal to be a same signal and setting the light-emitting control transistor and the initialization transistor to be a PMOS transistor and an NMOS transistor respectively, so that both the light-emitting control transistor and the initialization transistor can be controlled by the same signal. The light-emitting control signal line and the initialization signal line in a pixel circuit can use a same line for signal transmission, so that the number of light-emitting control signal line and initialization signal line is only half of existing number of lines. When the display panel includes a plurality of pixel circuits and a plurality light-emitting elements, a large number of initialization signal lines or light-emitting control signal lines can be saved, thereby simplifying a structure and improving resolution PPI of the display panel. In addition, signal generation of existing light-emitting control signal lines and initialization signal lines requires different signal driving circuits, and the signal driving circuits are usually set in a frame area outside a display area of the display panel. By setting the light-emitting control signal line and the initialization signal line as a same line, the number of existing signal driving circuits can be reduced in half, thereby simplifying a structure of the signal driving circuits. Reduction of the number of signal driving circuits in the frame area is also helpful to reduce a thickness of the frame area.

It should be noted that, the terms "comprising", "including" or any other variation thereof in this document are intended to encompass non-exclusive inclusion, such that a process, method, article or device comprising a series of elements not only includes those elements, but also includes other elements which are not expressly listed but inherent to such a process, method, article or apparatus.

Specific examples are used herein to illustrate the principles and implementations of the present application, and the descriptions of the above examples are only used to help understanding of the methods and core concepts of the present application. The above descriptions are only made with respect to preferred embodiments of the present application. It should be pointed out that, due to limitation of written expressions, there are objectively unlimited specific structures. For a person skilled in the art, several improvements, modifications or changes can also be made without departing from the principles of the present application, and the above-mentioned technical features can be combined in an appropriate manner; these improvements, modifications, or combinations, or application of the technical solutions of the present application directly to other situation without improvement, shall be regarded as within a protection scope of the present application.

What is claimed is:

1. A display panel, comprising:
   a pixel circuit and a light-emitting element;
   wherein the pixel circuit includes a driving transistor, a light-emitting control transistor and an initialization transistor;
   the driving transistor is configured to provide a driving current for the light-emitting element;
   the light-emitting control transistor is configured to selectively allow the light-emitting element to enter a light-emitting stage; and the initialization transistor is configured to provide an initialization signal for the light-emitting element;

wherein one of the light-emitting control transistor and the initialization transistor is a PMOS transistor and the other of the light-emitting control transistor and the initialization transistor is an NMOS transistor, and a gate electrode of the light-emitting control transistor is configured to receive a light-emitting control signal and a gate electrode of the initialization transistor is configured to receive the initialization signal; and wherein the light-emitting control signal and the initialization signal are a same signal.

2. The display panel according to claim 1, wherein the display panel comprises a light-emitting control signal line for providing the light-emitting control signal, wherein the light-emitting control signal line is connected to the gate electrode of the light-emitting control transistor and is connected to the gate electrode of the initialization transistor.

3. The display panel according to claim 1, wherein among the light-emitting control transistor and the initialization transistor, the PMOS transistor comprises a first gate electrode and a first active layer, and the NMOS transistor comprises a second gate electrode, a third gate electrode and a second active layer, wherein the second gate electrode and the third gate electrode are located on respective sides of the second active layer; and wherein the display panel comprises a light-emitting control signal line for providing the light-emitting control signal, wherein the light-emitting control signal line comprises a first light-emitting control signal line and a second light-emitting control signal line, the first light-emitting control signal line is connected to at least one of the first gate electrode and the second gate electrode, and the second light-emitting control signal line is connected to the third gate electrode.

4. The display panel according to claim 3, wherein the first gate electrode and the second gate electrode are provided in a same layer, and the first light-emitting control signal line is connected to both the first gate electrode and the second gate electrode within the same layer.

5. The display panel of claim 3, wherein the first gate electrode and the second gate electrode are provided in different layers;

the first light-emitting control signal line is provided in a same layer as the first gate electrode, and the first light-emitting control signal line is connected to the first gate electrode within the same layer, and the first light-emitting control signal line is connected to the second gate electrode through a via; or the first light-emitting control signal line is provided in a same layer as the second gate electrode, and the first light-emitting control signal line is connected to the second gate electrode within the same layer, and the first light-emitting control signal line is connected to the first gate electrode through a via.

6. The display panel according to claim 3, wherein the first light-emitting control signal line is connected to the first gate electrode, and the second light-emitting control signal line is connected to the third gate electrode;

the second gate electrode is connected to a fixed power signal line to receive a fixed power signal.

7. The display panel according to claim 3, wherein the display panel comprises a first driving circuit for providing the light-emitting control signal to the pixel circuit, and the light-emitting control signal line is connected to an output terminal of the first driving circuit; and wherein the first light-emitting control signal line and the second light-emitting control signal line are electrically connected through a first via, and the first via is provided between the first driving circuit and a display area of the display panel.

8. The display panel of claim 3, wherein the light-emitting control transistor is the PMOS transistor, and the initialization transistor is the NMOS transistor.

9. The display panel of claim 8, wherein an electrical conductivity of the first light-emitting control signal line is smaller than an electrical conductivity of the second light-emitting control signal line.

10. The display panel of claim 8, wherein a width of the first light-emitting control signal line is smaller than a width of the second light-emitting control signal line; and/or a length of the first light-emitting control signal line is greater than a length of the second light-emitting control signal line.

11. The display panel of claim 8, wherein the first light-emitting control signal line is connected to a first load element configured to adjust a load difference between the first light-emitting control signal line and the second light-emitting control signal line.

12. The display panel of claim 11, wherein the first load element is a capacitive element or a resistive element.

13. The display panel of claim 8, wherein the display panel comprises an initialization signal line for transmitting the initialization signal;

wherein in the case where the first light-emitting control signal line, the second light-emitting control signal line and the initialization signal line are orthographically projected onto a plane parallel to a surface of the display panel, a distance between the first light-emitting control signal line and the initialization signal line is greater than a distance between the second light-emitting control signal line and the initialization signal line.

14. The display panel of claim 3, wherein the first light-emitting control signal line and the second light-emitting control signal line are extended in a same direction and at least partially overlapped with each other.

15. The display panel of claim 1, wherein among the light-emitting control transistor and the initialization transistor, the PMOS transistor comprises a first gate electrode and a first active layer, and the NMOS transistor comprises a second gate electrode, a third gate electrode and a second active layer, wherein the second gate electrode and the third gate electrode are provided at respective sides of the second active layer; and wherein the display panel comprises a light-emitting control signal line for providing the light-emitting control signal, wherein the light-emitting control signal line, the first gate electrode and the second gate electrode are provided in a same layer and connected with each other, and the third gate electrode is connected to a fixed power signal line to receive a fixed power signal.

16. The display panel of claim 1, wherein the pixel circuit comprises a reset transistor, wherein the reset transistor is connected between a reset signal terminal and a gate electrode of the driving transistor and is configured to provide a reset signal to the gate electrode of the driving transistor.

17. The display panel of claim 16, wherein the drive transistor is a PMOS transistor, and the reset signal is a low-level signal; or the driving transistor is an NMOS transistor, and the reset signal is a high-level signal, and the light-emitting control transistor is configured to receive a first power signal so as to provide a high-level signal for the light-emitting element when in the light-emitting stage, wherein the first power signal is reused as the reset signal.

18. The display panel of claim 1, wherein the display panel further comprises a data-writing transistor and a first transistor;

the data-writing transistor is connected to a first electrode of the driving transistor, and is configured to provide a data signal for the driving transistor, and the first transistor is connected between a second electrode or a gate electrode of the driving transistor and the light-emitting element;

wherein during at least a part of a preceding stage of at least one frame, the first transistor and the initialization transistor are both in a turned-on state to enable the initialization signal to be written into the gate electrode of the driving transistor.

19. The display panel of claim 18, wherein the first transistor is connected to the second electrode of the driving transistor;

the pixel circuit further comprises a compensation transistor, wherein the compensation transistor is connected between the gate electrode and the second electrode of the driving transistor, and during at least a part of a preceding stage of at least one frame, all of the first transistor, the initialization transistor and the compensation transistor are in a turned-on state.

20. A display device comprising the display panel according to claim 1.

* * * * *